(12) United States Patent
Yamagishi et al.

(10) Patent No.: US 7,102,367 B2
(45) Date of Patent: Sep. 5, 2006

(54) PROBE CARD AND TESTING METHOD OF SEMICONDUCTOR CHIP, CAPACITOR AND MANUFACTURING METHOD THEREOF

(75) Inventors: Yasuo Yamagishi, Kawasaki (JP); Takeshi Shioga, Kawasaki (JP); John David Baniecki, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1 day.

(21) Appl. No.: 10/621,445

(22) Filed: Jul. 18, 2003

(65) Prior Publication Data

US 2004/0239349 A1 Dec. 2, 2004

(30) Foreign Application Priority Data

| Jul. 23, 2002 | (JP) | .......................... 2002-214476 |
| Jan. 29, 2003 | (JP) | .......................... 2003-020663 |
| Jul. 2, 2003  | (JP) | .......................... 2003-270360 |

(51) Int. Cl.
- *G01R 31/02* (2006.01)
- *H01R 13/00* (2006.01)
- *G01R 31/26* (2006.01)
- *H01L 29/08* (2006.01)

(52) U.S. Cl. ................................... 324/754
(58) Field of Classification Search ............... 324/754, 324/762–763, 765, 158.1, 73.1, 72.5; 439/482; 438/14, 18; 257/40, 48
See application file for complete search history.

(56) References Cited

U.S. PATENT DOCUMENTS

| 3,932,810 | A | * | 1/1976 | Kohler et al. ............... 324/126 |
| 4,862,077 | A | * | 8/1989 | Horel et al. ................. 324/754 |
| 4,928,061 | A | * | 5/1990 | Dampier et al. ............. 324/754 |
| 5,023,750 | A | * | 6/1991 | Hirayama .................... 361/313 |
| 5,047,817 | A | * | 9/1991 | Wakamiya et al. .......... 257/306 |
| 5,313,157 | A | * | 5/1994 | Pasiecznik, Jr. ............ 324/757 |
| 5,748,006 | A | * | 5/1998 | Sano ........................... 324/754 |
| 5,917,330 | A | * | 6/1999 | Miley .......................... 324/762 |
| 5,983,493 | A | * | 11/1999 | Eldridge et al. .............. 29/855 |
| 6,218,910 | B1 |  | 4/2001 | Miller ......................... 324/765 |
| 6,548,844 | B1 | * | 4/2003 | Fukuzumi et al. .......... 257/296 |
| 6,655,023 | B1 | * | 12/2003 | Eldridge et al. .............. 29/843 |
| 6,727,579 | B1 | * | 4/2004 | Eldridge et al. ............ 257/692 |
| 6,800,889 | B1 | * | 10/2004 | Takatani et al. ............ 257/295 |
| 6,818,469 | B1 | * | 11/2004 | Mori et al. ................... 438/52 |
| 6,911,835 | B1 | * | 6/2005 | Chraft et al. ............... 324/754 |
| 6,967,557 | B1 | * | 11/2005 | Hagios et al. .............. 336/200 |

FOREIGN PATENT DOCUMENTS

| EP | 0 840 133 A2 | 5/1998 |
| JP | 7-111280     | 4/1995 |
| JP | 10-132855    | 5/1998 |

* cited by examiner

*Primary Examiner*—Jermele Hollington
(74) *Attorney, Agent, or Firm*—Armstrong, Kratz, Quintos, Hanson & Brooks, LLP

(57) ABSTRACT

A probe card includes probes, a build-up interconnection layer having a multilayer interconnection structure therein and carrying the probes on a top surface in electrical connection with the multilayer interconnection structure, and a capacitor provided on the build-up interconnection layer in electrical connection with one of the probes via the multilayer interconnection structure, wherein the multilayer interconnection structure includes an inner via-contact in the vicinity of the probe and the capacitor is embedded in a resin insulation layer constituting the build-up layer.

7 Claims, 15 Drawing Sheets

RELATED ART

US 7,102,367 B2

PROBE CARD AND TESTING METHOD OF SEMICONDUCTOR CHIP, CAPACITOR AND MANUFACTURING METHOD THEREOF

CROSS-REFERENCE TO RELATED APPLICATION

The present application is based on Japanese priority application Nos. 2002-214476, 2003-020663 and 2003-270360 filed respectively on Jul. 23, 2002, Jan. 29, 2003 and Jul. 2, 2003, the entire contents of which are hereby incorporated by reference.

BACKGROUND OF THE INVENTION

The present invention generally relates to semiconductor devices and more particularly to a probe card and testing method suitable for use with a high-speed semiconductor device operating with a clock rate of 1 GHz or more. Further, the present invention relates to a capacitor used for a decoupling capacitor of a high-speed semiconductor device and manufacturing method thereof.

Conventionally, probe cards have been used for testing electric properties and circuit functions of semiconductor chips formed on a semiconductor wafer. Typically, the testing is conducted in the state the semiconductor chips are still in the form of a wafer, and the probe card is urged against the wafer so that probes provided on the probe card make a contact with corresponding electrode pads on the semiconductor chip. Thereby, the probe card provides interconnection between the semiconductor chip and a testing apparatus to which the probe card is connected, by means of the probes and an interconnection structure provided on the probe card.

For example, Japanese Laid-Open Patent Application 6-140048 discloses such a probe card formed of a ceramic substrate carrying thereon a wiring pattern. In this conventional probe card, contact pads provided on the wiring pattern make a contact with corresponding electrode pads on the semiconductor device, and the interconnection pattern provides electrical connection between the foregoing contact pads. Further, input/output electrode pads are provided on the probe card for in and out of probe signals. Further, the foregoing interconnection pattern forms a thin film resistor or capacitor on the ceramic substrate and achieves impedance control and cutoff of power-line noise.

Japanese Laid-Open Patent Application 7-111280 discloses another probe card that carries a plurality of probes at a rear surface of the probe card. In this construction, the interconnection pattern is provided on the front surface, and various exterior circuit parts such as bypass capacitors or wave-shaping circuits are connected to this interconnection pattern at the front side of the probe card substrate. Such a construction of providing the probes and exotic circuit components at different sides of the probe card substrate makes it possible to dispose the exotic circuit components immediately adjacent to the probes. Thereby, the accuracy of testing is improved.

Japanese Laid-Open Patent Application 10-132855 discloses a probe card in which probes for contacting with a semiconductor device to be tested are provided on a multi-layer circuit board at a first side thereof and chip components such as inductors, capacitors, resistors, and the like, that can form an electric circuit together with the semiconductor device, are provided on a second side of the multilayer circuit board. By using such a probe card, it becomes possible to conduct the test of the semiconductor chip in the state close to the case in which the semiconductor chip is actually used, and the accuracy of the test is improved.

Further, Japanese Laid-Open Patent Application 2000-304770 discloses a probe card in which a build-up interconnection structure is formed on a support substrate and a plurality of probes are formed on the uppermost layer of the build-up interconnection structure. By using the build-up interconnection structure, it becomes possible to realize intricate and complex wiring, thus allowing a highly dense arrangement of the probes.

Japanese Laid-Open Patent Application 2001-102418 provides a probe device in which a detachable contactor, formed of a ceramic substrate carrying probes thereon, is connected to a pin-electronic package via an interposer, and the structure thus formed is mounted on a circuit board. In this reference, the pin-electronic package includes various circuits such as drivers, comparators, and dynamic loaders. Further, the pin-electronic package may include a cooling device in view of severe heating caused by these circuits.

Meanwhile, in the testing process of recent high-speed semiconductor devices, which generally have a very large number of terminals, there is a demand for a probe card that the probes are provided with large density in correspondence to the electrode pads formed on the semiconductor chip with high density and further that a decoupling capacitor is provided immediately adjacent to the probes for effectively suppressing the high-frequency noise.

With regard to the semiconductor device, there has been developed recently a semiconductor package for a ultrahigh speed semiconductor chip operable at the clock rate of 1 GHz or more. In such a semiconductor package, a semiconductor chip and a capacitor are mounted at respective sides of a build-up substrate, wherein a very thin build-up substrate having a thickness of 1 mm or less is generally used for minimizing the inductance between the semiconductor chip and the capacitor.

Further, there is proposed a new process of forming an extremely thin build-up substrate directly on an LSI chip to form a BBUL (bumpless build-up layer) structure (Nikkei Microdevices, December 2001, pp. 178), wherein this BBUL structure provides a decoupling capacitor on the uppermost layer of the build-up substrate formed on the LSI chip in electrical connection with the LSI chip via the build-up substrate.

In such ultrahigh-speed semiconductor devices, meaningful test can be achieved only when the decoupling capacitor is provided immediately adjacent to the semiconductor chip to be tested so that the semiconductor chip to be tested operates just in the same way as it is actually used during the test.

Conventionally, there has been no probe card that can satisfy such a demand.

In the case of the probe card of Japanese Laid-Open Patent Application 2000-304770, for example, it can certainly test a semiconductor chip having a large number of contact terminals arranged in high density by providing the probes on the probe card substrate with corresponding high density. However, such a construction provides a very narrow gap between the probe card and the semiconductor chip, and there is no choice but to provide the decoupling capacitor at the rear side of the probe card substrate, just as in the case of Japanese Laid-Open Patent Application 10-132855. On the other hand, the substrate of a probe card for testing high-speed semiconductor chips generally has a thickness of 3–5 mm in view of the need of carrying complex wiring patterns and in view of the need of having a sufficient rigidity, which is required for achieving uniform contact when the probes are urged to a semiconductor chip at the time of testing.

In the construction of the Japanese Laid-Open Patent Application 10-132855, in particular, the wiring length for the interconnection between the capacitor component provided at the rear side of the multilayer substrate and the electrodes of the semiconductor chip to be tested becomes as large as about 6 mm. Thereby, the inductance associated with the long interconnection causes a problem that the capacitor cannot cut off the high-frequency noise effectively when the semiconductor chip is operated at high speed during the test.

Meanwhile, there is a demand also in recent ultrahigh-speed and ultra low-power semiconductor devices and LSIs, such as microprocessors, to suppress the fluctuation of the supply voltage while it is operated by cutting the switching noise so that a stable device operation is maintained even when there has been caused a sudden change of the load.

In view of such a demand, it has been practiced to provide a decoupling capacitor in the vicinity of a semiconductor chip for absorbing the high-frequency noise such as switching noise.

On the other hand, such a construction generally uses a wiring pattern for connecting the semiconductor device to the decoupling captor, and thus, there arises the problem that the inductance associated with such a wiring pattern causes the problem that the effectiveness of the decoupling capacitor of cutting the high-frequency noise is degraded seriously.

In order to avoid this problem, there has been a proposal to construct the decoupling capacitor in the form of an interposer. Thereby, the capacitor configured in the form of an interposer is disposed right underneath the semiconductor chip, and the wiring length between the capacitor and the semiconductor chip is minimized.

FIGS. 1A and 1B show the construction of a semiconductor device 100 having an interposer-type decoupling capacitor.

Referring to FIG. 1A, the semiconductor device 100 has a construction in which an interposer-type decoupling capacitor 102 is mounted upon a semiconductor chip by way of bumps 103A. Further, the decoupling capacitor 102 thus carrying the semiconductor chip 101 thereon is mounted on a package substrate 104 by way of bumps 103B. Further, the package substrate 104 thus carrying thereon the decoupling capacitor 102 and the semiconductor chip 101 is mounted on a circuit substrate 105 by way of bumps 106.

By using the interposer-type decoupling capacitor 102, the wiring length from the semiconductor chip 101 to the decoupling capacitor 102 becomes minimum, and elimination of high-frequency noise can be achieved effectively.

The construction of FIG. 1A can also be modified as represented in FIG. 1B, wherein FIG. 1B shows a semiconductor device 100A that uses a package substrate 104A in place of the package substrate 104. As can be seen, the package substrate 104A has a depression. In FIG. 1B, those parts corresponding to the parts described previously are designated by the same reference numerals and the description thereof will be omitted.

By accommodating the interposer-type decoupling capacitor 102 into such a depression, the construction of FIG. 1B can reduce the distance between the semiconductor chip 101 and the circuit substrate 105.

Such an interposer-type decoupling capacitor is generally formed on a substrate having a flat and smooth surface.

FIGS. 2A–2D show a part of the process of forming such a conventional interposer-type decoupling capacitor.

Referring to the drawings, the decoupling capacitor uses a silicon substrate 201 shown in FIG. 2A and forms a lower electrode 202 on the silicon substrate 201 as represented in FIG. 2B.

Next, as represented in FIG. 2C, a dielectric film 203 is formed on the lower electrode and an upper electrode 204 is formed on the dielectric layer 203 in the step of FIG. 2D.

After the step of FIG. 2D, the laminated structure of FIG. 2D is subjected to a process of forming through-holes such that the through-holes penetrate through the silicon substrate from a first side to a second, opposite side, while such a process of forming the through-holes takes substantial time, and the cost of the interposer-type decoupling capacitor is increased as a result. Further, there is a need of providing an interconnection pattern including the process of forming via-holes during the process of forming the interposer-type decoupling capacitor.

As noted above, the problem of using the interposer-type decoupling capacitor such as the one shown in FIG. 1A is that the distance between the bottom surface of the semiconductor chip 101 and the top surface of the package substrate 104, and hence the distance between the bottom surface of the semiconductor chip 101 and the top surface of the circuit substrate 105, is increased as a result of the use of the interposer-type decoupling capacitor 102. While the construction of FIG. 1B reduces this problem to some extent, the use of the interposer-type decoupling capacitor nevertheless raises the problem of increased distance between the semiconductor chip 101 and the circuit substrate 105 and associated problem of increase of inductance.

SUMMARY OF THE INVENTION

Accordingly, it is a general object of the present invention to provide a novel and useful probe card and a testing method of a semiconductor device by using such a probe card. Further, the present invention provides a capacitor and a manufacturing method thereof.

Another object of the present invention is to provide a probe card for testing a semiconductor chip, comprising:

a plurality of probes;

a build-up interconnection layer having a multilayer interconnection structure therein, said build-up interconnection layer carrying said plurality of probes on a top surface thereof in electrical connection with said multilayer interconnection structure; and a capacitor embedded in a resin insulation layer constituting said build-up interconnection layer in electrical connection with one of said probes via said multilayer interconnection structure, said multilayer interconnection structure including an inner via-contact in the vicinity of said probe.

Another object of the present invention is to provide a testing method of a semiconductor device by using a probe card, said probe card comprising: a plurality of probes; a build-up interconnection layer having a multilayer interconnection structure therein, said build-up interconnection layer carrying said plurality of probes on a top surface thereof in electrical connection with said multilayer interconnection structure; and a capacitor embedded in a resin insulation layer constituting said build-up interconnection layer in electrical connection with one of said probes via said multilayer interconnection structure, said multilayer interconnection structure including an inner via-contact in the vicinity of said probe, said method comprising the steps of:

causing said probe card to make a contact with a semiconductor chip to be tested such that said semiconductor chip is in electrical connection with said probe card; and testing electric properties of said semiconductor chip, said method further comprising the step, before contacting said probe card to said semiconductor chip, of setting an impedance between said probe and said capacitor to be substantially equal to an impedance of a semiconductor package including therein said semiconductor chip and a capacitor, for a part between said semiconductor chip and said capacitor.

According to the present invention, it becomes possible to dispose a decoupling capacitor immediately adjacent to a probe and the inductance between the probe and the decoupling capacitor is minimized. Thereby, it becomes possible to conduct the testing of ultrahigh speed semiconductor chip while operating the semiconductor chip at ultrahigh speed. Further, it becomes possible to set the impedance (Zp) of the probe card for the part between the probe and the capacitor to be equal to the impedance of the corresponding part of a semiconductor package in which the semiconductor chip is actually used. Thereby, the testing is conducted under the condition similar to the case the semiconductor chip is in actual use, and the accuracy of the testing is improved. Such a testing can be conducted in the state the semiconductor chip forms a wafer or in the state of discrete semiconductor chips divided from a wafer.

Another object of the present invention is to provide a probe card for testing a semiconductor chip, comprising:

a first interconnection board;

a second interconnection board mounted on said first interconnection board in such a manner that a gap is formed between said first interconnection board and said second interconnection board;

a plurality of probes provided on said second interconnection board at a surface away form said first interconnection board; and a decoupling capacitor provided on said second interconnection board at a surface facing said first interconnection board.

Another object of the present invention is to provide a probe card for testing a semiconductor chip, comprising:

a first interconnection board;

a second interconnection board mounted on said first interconnection board such that there is formed a gap between said first interconnection board and said second interconnection board; and a plurality of probes provided on said second interconnection board at a surface away from said first interconnection board, a difference of thermal expansion coefficient between said first interconnection board and said second interconnection board is 2 ppm/° C. or less.

Another object of the present invention is to provide a testing method of a semiconductor chip by using a probe card, said probe card comprising: a first interconnection board; a second interconnection board mounted on said first interconnection board in such a manner that a gap is formed between said first interconnection board and said second interconnection board; a plurality of probes provided on said second interconnection board at a surface away form said first interconnection board; and a decoupling capacitor provided on said second interconnection board at a surface facing said first interconnection board, said method comprising the step, before contacting said probe card to said semiconductor chip, of setting an impedance between said probe and said capacitor to be substantially equal to an impedance of a semiconductor package including therein said semiconductor chip and a capacitor, for a part between said semiconductor chip and said capacitor.

According to the present invention, it becomes possible to design the first connection board with large degree of freedom with regard to the materials used therefor or size, and the cost of the probe card is reduced. Further, the probe card of the present invention allows replacement of the first interconnection board in the event it is damaged. By designing the probe card such that the second connection board is replaceable, it becomes possible to test various semiconductor chips of different types or models efficiently by merely replacing the second interconnection board. In the probe card of the present invention noted above, too, it becomes possible to dispose the decoupling capacitor right underneath the probe, and the testing of the semiconductor chip can be conducted in the state close to the state in which the semiconductor chip is actually used. The present invention allows testing of different semiconductor chips, and the need of tailoring the probe card of exclusive use for various different semiconductor chip types is eliminated.

Another object of the present invention is to provide a capacitor, comprising:

a dielectric film;

a first electrode film formed on a first principal surface of said dielectric film;

a second electrode film formed on a second principal surface of said dielectric film;

a first interconnection part extending from said first electrode film to a first side of a laminated structure formed of said dielectric film and said first and second electrode films; and a second interconnection part extending from said second electrode film to said first side, a resin layer being formed on a second side of said laminated structure.

Another object of the present invention is to provide a semiconductor device, comprising:

a capacitor; and a semiconductor chip on which said capacitor is mounted;

said capacitor comprising: a dielectric film; a first electrode film formed on a first principal surface of said dielectric film; a second electrode film formed on a second principal surface of said dielectric film; a first interconnection part extending from said first electrode film to a first side of a laminated structure formed of said dielectric film and said first and second electrode films; and a second interconnection part extending from said second electrode film to said first side, a resin layer being formed on a second side of said laminated structure.

Another object of the present invention is to provide a manufacturing method of a capacitor, comprising the steps of:

forming a first insulation film of a resin on a substrate;

forming a first electrode film on said first insulation film;

forming a dielectric film on said first electrode film;

forming a second electrode film on said dielectric film; and removing said substrate by an etching process such that said first insulation film is exposed.

According to the present invention, it becomes possible to construct an extremely thin capacitor by removing the support substrate after formation of the capacitor and by providing the first and second interconnection parts such that the first and second interconnection parts extends to the same side of the laminated structure. It should be noted that the total thickness of the capacitor is reduced significantly in the present invention as compared with the case, in which the first and second interconnection parts are extending in the first and second, mutually opposite directions from the first and second electrode films. Such a thin capacitor can be mounted easily on a semiconductor chip by a surface mounting technology while using the minute space or gap formed between the semiconductor chip and a substrate on which the semiconductor chip is mounted. As long as the capacitor is formed with an area of 2 mm$^2$ or less, there occurs no practical problem of causing damage to the capacitor during handling of the capacitor. It should be noted that the capacitor of the present invention can successfully avoid damaging even after the substrate is etched away, by providing the resin support layer such that the resin support layer supports the foregoing laminated structure at the first side.

Other objects and further features of the present invention will become apparent from the following detailed description when read in conjunction with the attached drawings.

DETAILED DESCRIPTION OF THE INVENTION

Figure 1A:
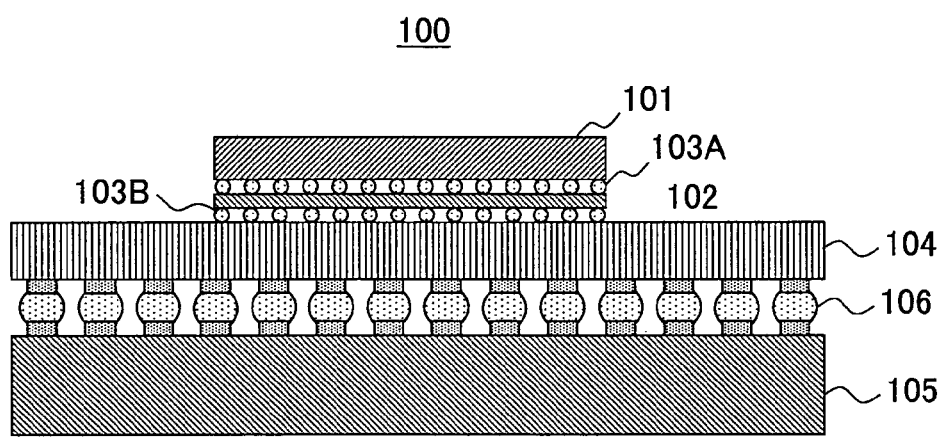
FIGS. 1A and 1B are diagrams showing a conventional semiconductor device having an interposer-type decoupling capacitor.
Figure 1B:
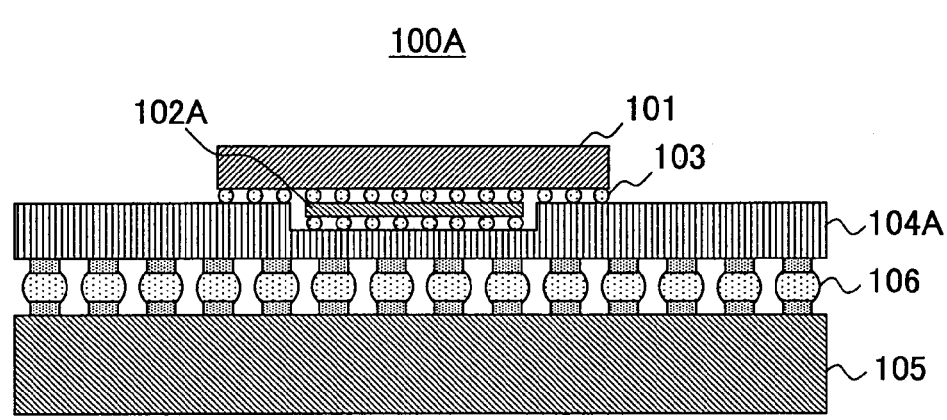
Figure 2A:
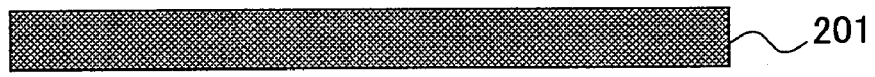
FIGS. 2A–2D are diagrams showing a part of the process of forming an interposer-type decoupling capacitor.
Figure 2B:
Figure 2C:
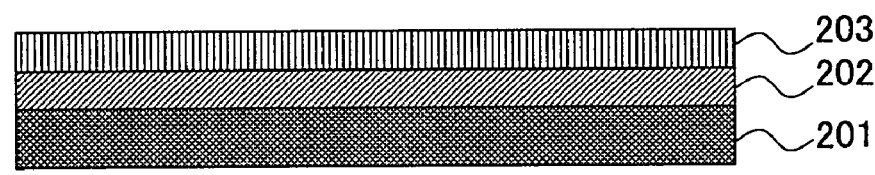
Figure 2D:
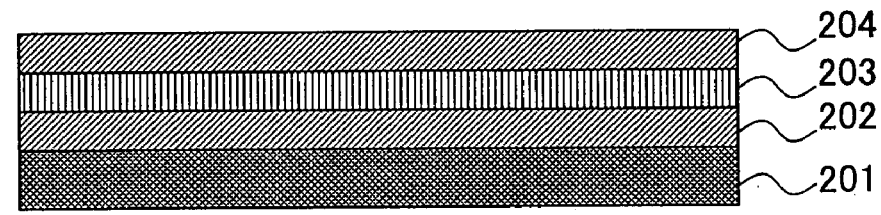
Figure 3:
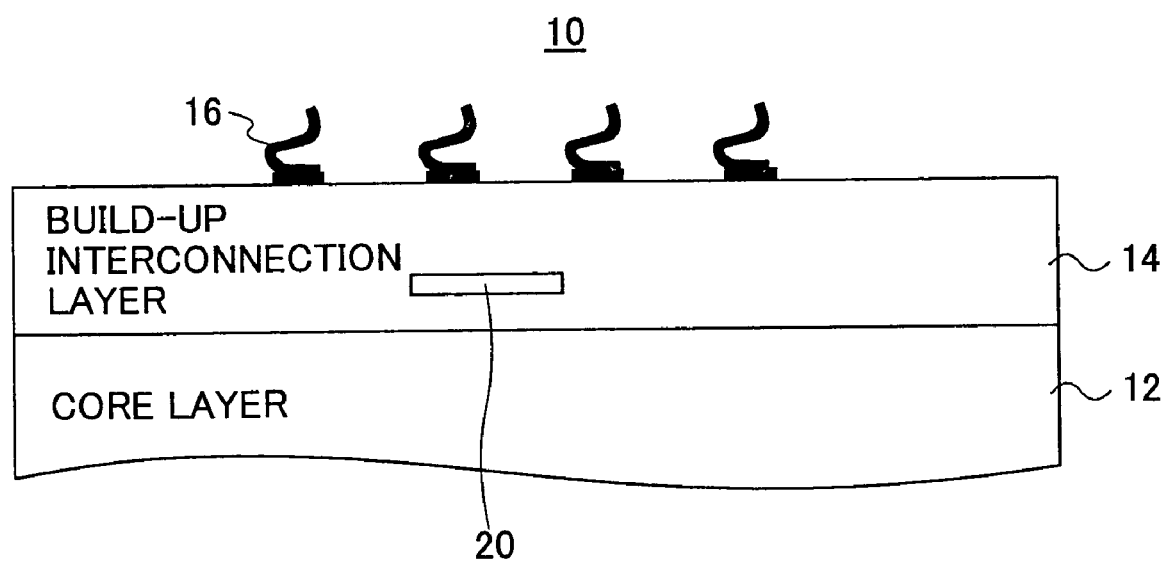
FIG. 3 is a diagram showing the construction of a probe card according to a first embodiment of the present invention.

FIG. 3 shows the fundamental construction of a probe card 10 according to a first embodiment of the present invention.

Referring to FIG. 3, the probe card 10 is formed of a core layer 12 and includes a build-up interconnection layer 14 formed on the core layer 12 wherein the build-up interconnection layer 12 includes a plurality of interconnection patterns. Further, probes 16 are formed on the top surface of the build-up interconnection layer 14.

It should be noted that the probe card 10 further includes a thin-film capacitor 20 provided inside the build-up interconnection layer 14. Further, the probe card 10 has a feature in that the interconnection patterns inside the build-up interconnection layer 14 constitute a multilayer interconnection structure. Thereby, the multilayer interconnection structure includes an inner via-contacts in the vicinity of the probes 16, and the thin-film capacitor 20 is embedded in a resin insulation layer constituting the build-up interconnection layer 14.

Figure 4:
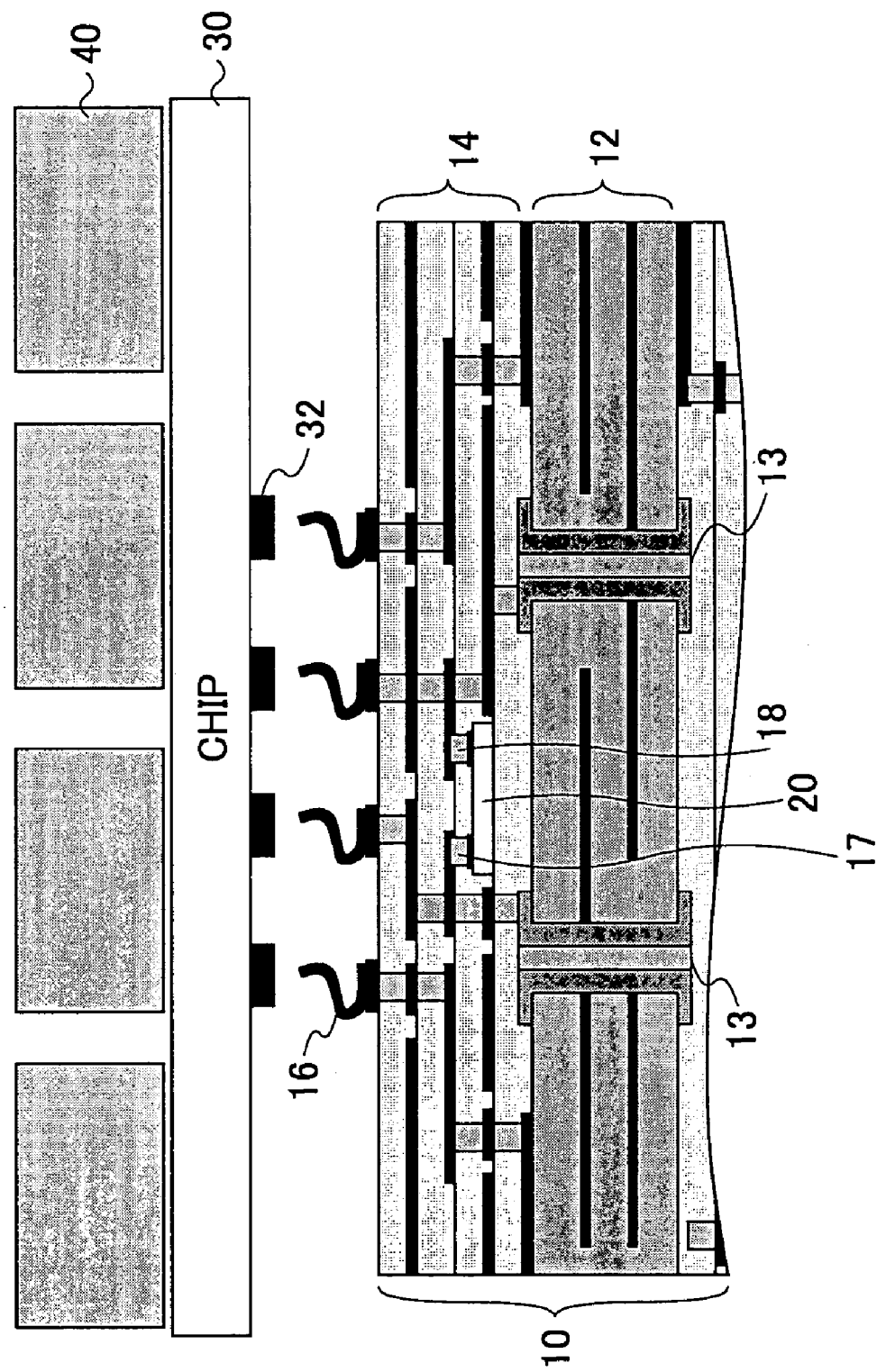
FIG. 4 is a diagram showing the testing conducted upon a semiconductor chip by using the probe card of FIG. 3.

FIG. 4 shows an example of conducting a test of a semiconductor chip 30 by using the probe card 10 of FIG. 3 in a cross-sectional view.

Referring to FIG. 4, the semiconductor chip 30 to be tested forms a wafer and is held by a wafer chuck 40. Thereby, the probe card 10 conducts the test for the semiconductor chips 30 thus formed on the wafer one by one. In each semiconductor chip 30, the probes 16 are caused to make a contact with corresponding electrode pads 32 formed on the semiconductor chip, and the test is conducted by supplying electric power and test signals to the semiconductor chip 30 from a tester (not shown) via the probes 16. The tester further examines the electric signals returned from the semiconductor chip 30 via the probe card 10, wherein the electric signals are supplied from the semiconductor chip 30 to the probe card 10 also via the probes 16.

In the illustrated example, the core layer 12 is formed of lamination of four glass epoxy layers and includes through-holes 13 filled with an epoxy resin. Further, a pair of build-up interconnection layers including a build-up layer 14 are provided respectively at a first side and a second side of the core layer 12.

Referring to FIG. 4, the build-up layer 14 includes lamination of four resin layers each carrying an interconnection pattern, and there is formed a multilayer interconnection structure in the build-up layer 14, wherein each of the resin layers of the build-up layer 14 has a thickness of about 45 µm. Further, it can be seen that a thin-film capacitor 20 having a thickness of about 30 µm is embedded in a resin layer located between the third and fourth interconnection layers counted from the top surface of the build-up layer 14. Thereby, the ground terminal and the power supply terminal of the thin-film capacitor 20 are connected respectively to a ground line 17 and a power supply line 18.

Although the probe card 10 of the illustrated example includes only one thin-film capacitor 20, the present invention is by no means limited to such a specific construction and there may be provided plural thin-film capacitors 20 connected to different power supply lines, particularly in the case the probe card 10 is designed to test a semiconductor chip 10 that uses plural, different supply voltages.

In the probe card 10 of FIG. 4, the probes 16 are soldered upon electrodes exposed at the uppermost layer of the build-up interconnection layer 14, wherein each probe 16 has a tip end twisted or bent such that the probe 16 makes a contact with the electrode pad 32 of the semiconductor chip 30 to be tested generally in the direction perpendicular to the principal surface of the electrode pad 32. Thus, at the time of testing of the semiconductor chip 30, the probes 16 are caused to make a contact with corresponding electrode pads 32 of the semiconductor chip 30.

Figure 5:
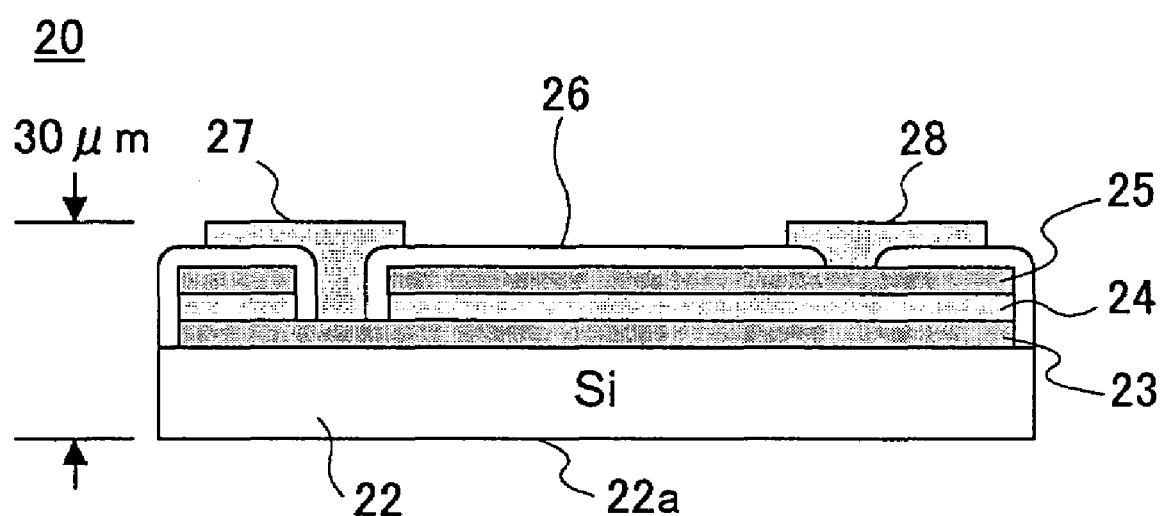
FIG. 5 is a diagram showing the construction of a decoupling capacitor used in the construction of FIGS. 3 and 4.

FIG. 5 shows the construction of the thin-film capacitor 20 used for the probe card 10 of the present invention. As noted previously, the thin-film capacitor 20 of the present invention functions as a decoupling capacitor for cutting the high frequency noise during the testing of the ultrahigh speed semiconductor chip 20.

As represented in FIG. 5, the capacitor 20 is formed on a silicon substrate 22 and has a construction that a dielectric film 24 formed of a high-K material such as $BaSrTiO_3$, or the like, is sandwiched between a lower electrode layer 23 and an upper electrode layer 25 on the silicon substrate 22. Typically, the electrodes 23 and 25 are formed of Pt, and the silicon substrate 22 is subjected to a polishing process at a bottom surface 22a thereof after formation of the capacitor. The total thickness of this thin-film capacitor 20, including the silicon substrate 22 and terminal electrodes 27 and 28, is 30 µm or less, wherein the terminal electrodes 27 and 28 are connected respectively to the lower electrode 23 and the upper electrode 25. It should be noted that both of the terminal electrodes 27 and 28 extend to the topside of the capacitor 20 and form a flat contact surfaces aligned at the same height. Thus, the capacitor 20 has a structure suitable for mounting by using surface mounting technology.

FIGS. 6A–6G show the manufacturing process of the thin-film capacitor 20.

Figure 6F:
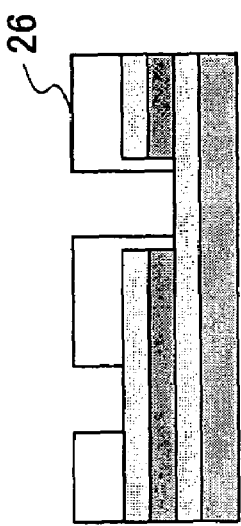
FIGS. 6A–6G are diagrams showing the process of manufacturing the capacitor of FIG. 5.
Figure 6G:
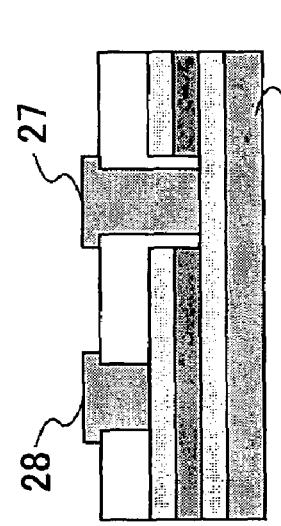
Figure 6A:
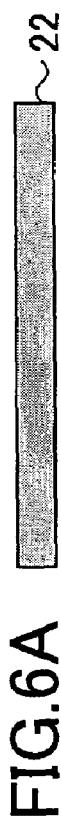

Referring to FIG. 6A, the capacitor 20 is formed on the silicon substrate 22 as explained before, wherein the silicon substrate 22 functions as a support substrate supporting the laminated capacitor structure formed thereon during the process of formation of the thin-film capacitor 20. By using the silicon substrate 22 for such a supporting substrate, thinning of the capacitor 20 by polishing the bottom surface 22a of the silicon substrate 22 is achieved easily. It should be noted that a silicon thin film is not easily broken even when the thickness thereof is reduced to about 20 µm.

Further, as represented in FIGS. 6B–6G, the lower electrode layer 23, the high-K dielectric layer 24 and the upper electrode layer 25 are formed consecutively on the silicon substrate 22, wherein the silicon substrate 22 has a thickness of 0.3 mm and carries thereon a thermal oxide film (not shown).

Figure 6B:
Figure 6C:
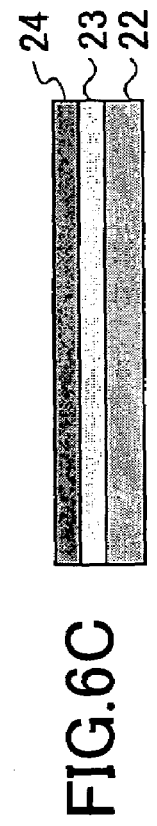
Figure 6D:
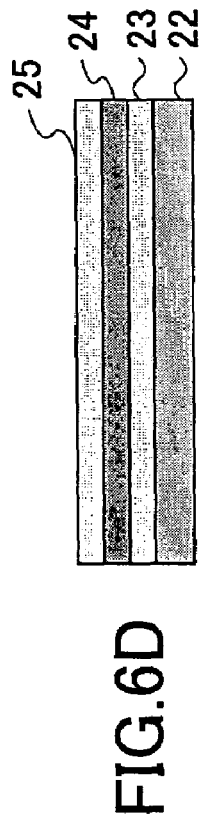

First, the lower electrode layer 23 is formed on such a silicon substrate 22 in the step of FIG. 6B by conducting a sputtering process of $TiO_2$(0.05 µm)/Pt(0.1 µm) laminated structure. Next, a film of (Ba, Sr)$TiO_3$ (refereed to hereinafter as BST) is deposited thereon in the step of FIG. 6C to form the high-K dielectric film 24 by a sputtering process. Further, the upper electrode 25 is formed on the high-K dielectric film 24 by conducting a sputtering process of Pt with the thickness of 0.1 µm.

Further, the high-K dielectric film 24 used for the thin-film capacitor 20 of the present invention is not limited to BST, but any complex oxide containing at least one of Sr, Ba, Pb, Sn, Zr, Bi, Ta, Ti, Mg, Nb, and the like, may be used for the same purpose. In terms of the compound, the high-K dielectric film 24 may be formed, in addition to BST noted above, of any of Pb(Zr, Ti)$O_3$, Pb(Mg, Nb)$O_3$, SrBi2$Ta_2O_9$, $Ta_2O_5$, and the like.

Further, the electrode layers 23 and 25 is not limited to Pt, but a metal film containing at least one of Au, Cu, Pb, Ru, Ir and Cr, or a metal oxide of Ru or Ir may be used for the same purpose.

Figure 6E:
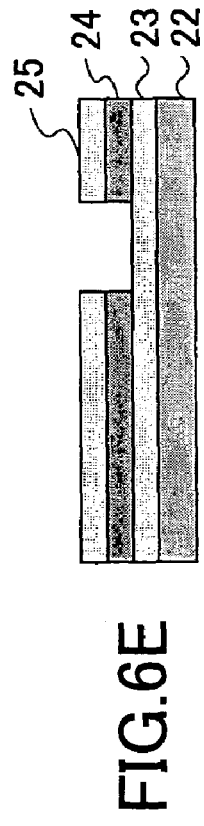

Next, in the step of FIG. 6E, the upper electrode layer 25 and the dielectric film 24 are patterned to form a contact hole, and the foregoing layers 23–25 are further patterned to form the chip of the capacitor 20 by way of conducting an Ar ion milling process.

Next, in the step of FIG. 6F, a polyimide layer 26 is formed on the structure obtained in the step of FIG. 6E such that the polyimide layer 26 has contact holes respectively exposing the upper electrode 25 and the lower electrode 23. Further, a Cr film, a Cu film and an Au film are deposited consecutively on the structure of FIG. 6F with respective thicknesses of 0.05 µm, 1 µm and 10 µm, and as a result, the terminal electrodes 27 and 28 are formed respectively in electrical connection with the upper electrode 25 and the lower electrode 23 as represented in FIG. 6G.

Thereafter, the bottom surface 22a of the silicon substrate 22 is subjected to the polishing process, and the thickness of the capacitor 20, including the silicon substrate 22 and the terminal electrodes 27 and 28, is reduced to 30 µm.

Thus, by using the thin-film capacitor 20 thus formed, the probe card 10 is completed.

More specifically, the probe card 10 of FIG. 3 or FIG. 4 is completed by connecting the terminal electrodes 27 and 28 of the capacitor 20 in electrical connection with interconnection patterns such as a ground line 17 or a power line 18 provided in the build-up interconnection layer 14 as represented in FIG. 4.

Next, the process of forming the build-up interconnection layer 14 used for manufacturing the probe card 10 will be explained particularly with regard to the step of embedding the thin-film capacitor 20 in the build-up interconnection layer 1

Figure 7A:
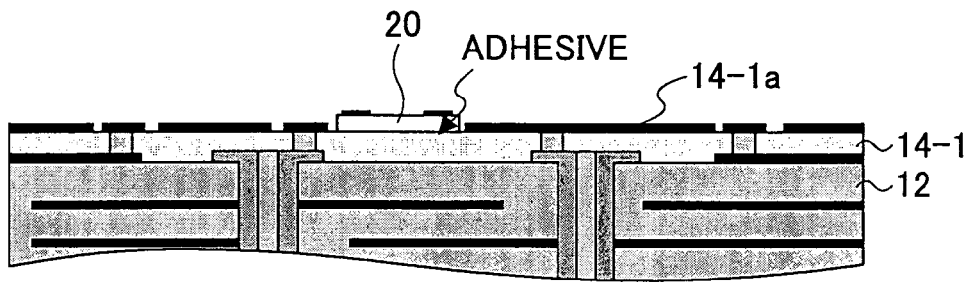
FIGS. 7A–7C are diagrams showing the manufacturing process of the probe card of the first embodiment.
Figure 7B:
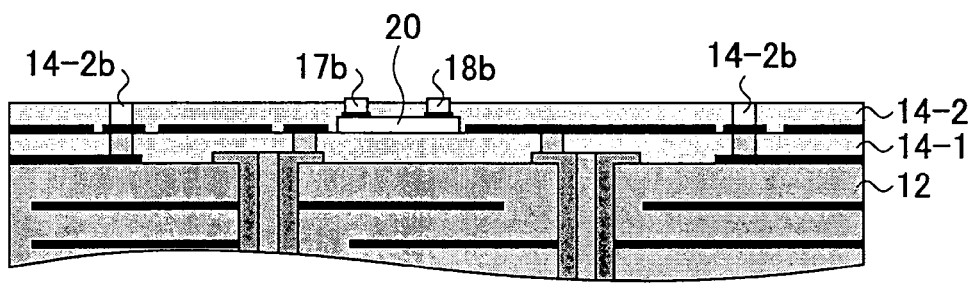
Figure 7C:
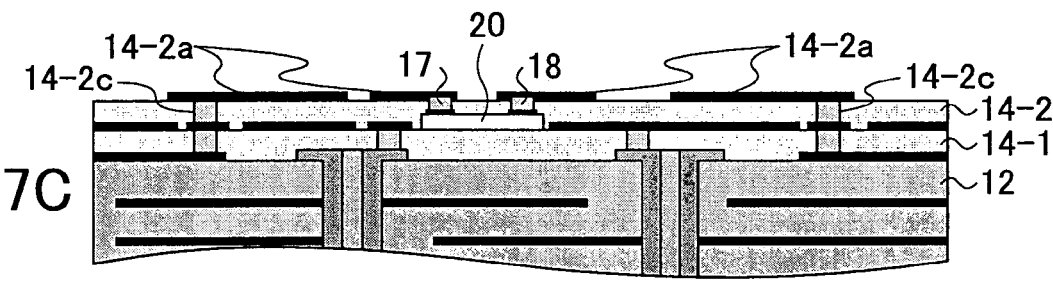
Figure 8:
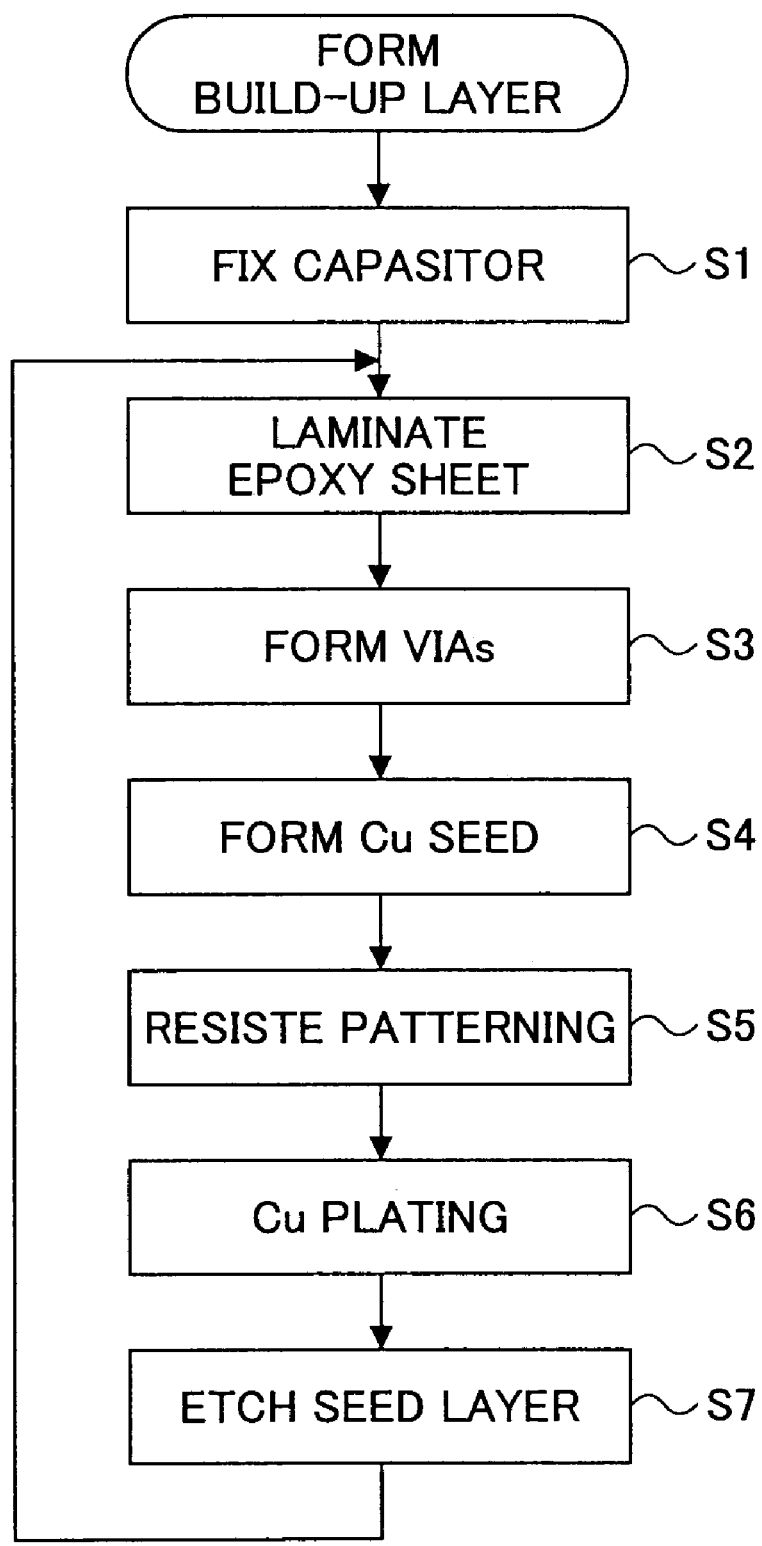
FIG. 8 is a flowchart corresponding to the process of FIGS. 7A–7C.

FIGS. 7A–7C show the process of embedding the thin-film capacitor 20 in the build-up interconnection layer 14, while FIG. 8 shows the flowchart explaining the process of FIGS. 7A–7C. It should be noted that the multilayer interconnection structure in the build-up interconnection layer 14 is formed by repeating the steps S2–S7 of FIG. 8.

Referring to FIG. 8, the chip of the capacitor 20 is bonded upon a desired location on the core layer 12 or an insulation layer 14-1 of the build-up interconnection layer 14 formed already, by using an adhesive in the step of FIG. 7A. Here, it should be noted that an interconnection pattern 14-1a is formed already on the insulation layer 14-1 by conducting an electroplating process of a Cu film.

Next, in the step S2 of FIG. 8, an epoxy film of half-cured state is laminated on the core layer 12, or alternatively on the insulation layer 14-1 of the build-up interconnection layer 14 formed already. As a result, there is formed an insulating resin layer 14-2 shown in FIG. 7B such that the resin layer 14-2 covers the thin-film capacitor 20.

Next, in the step S3, via-holes 14-2b are formed in the foregoing resin layer 14-2 by way of applying a laser beam of a $CO_2$ laser as represented in FIG. 7B, wherein the step S3 includes also the step of forming via-holes 17b and 18b in the resin layer 14-2 also by the laser beam respectively in correspondence to the ground line 17 and the power line 18.

Next, in the step S4, a thin Cu seed layer (not shown) is formed on the surface of the resin layer 14-2 of FIG. 7B by a non-electrolytic plating process. In order to improve adherence, it is preferable to apply a roughening process on the surface of the resin layer 14-2 before conducting the non-electrolytic plating process.

Next, in the step S5, a resist film is provided on the structure of FIG. 7B such that the resist film covers the resin layer 14-2 uniformly, followed by a patterning process so as to form resist openings in correspondence to the interconnection patterns and the via-holes 17b and 18b.

Next, in the step S6 of FIG. 8, an electrolytic plating process of Cu is conducted while using the resist pattern as a mask such that a Cu layer fills the resist openings thus formed, and there are formed Cu patterns 14-2a and Cu plugs 14-2c at the resist openings, wherein the Cu plugs thus formed includes a ground line contact plug 17 and a power line conduct plug 18 as represented in FIG. 7C. It should be noted that FIG. 7C shows the state in which the resist film is removed.

Next, in the step S7, the seed layer formed previously is patterned while using the Cu patterns 14-2c and the Cu plugs 17 and 18 as a self-aligned mask.

Further, by repeating the steps S2–S7, the build-up interconnection layer 14 including therein the embedded thin-film capacitor chip 20 is obtained easily.

Further, the probes 16 are formed on the uppermost layer of the build-up interconnection layer 14 in correspondence to the inner via-contacts 14-2c or in the vicinity thereof and the structure of FIG. 4 is obtained.

It should be noted that the probe card 10 explained above reduces the inductance between the probe 16 and the decoupling capacitor 20 by a factor of ⅕–1/10 as compared with the conventional structure in which the capacitor is mounted on the rear side of the probe card substrate. As a result, the power-line noise is effectively suppressed during the high-speed test of the semiconductor chip even in the case the semiconductor chip is operated with the clock rate of 1 GHz or more, and the accuracy of the test is improved substantially.

It should be noted that the process of forming the inner via-contacts 14-2c is not limited to the build-up process explained before. For example, the inner via-contacts 14-2c can be formed also by a simultaneous lamination process. Further, the thin-film capacitor 20 used in the probe card 10 of the present embodiment is not limited to the one described with reference to FIG. 5 in which the terminal electrodes 27 and 28 are provided at the same side of the capacitor chip. Thus, a capacitor having the terminal electrodes at the opposite sides of the capacitor chip may also be used. In such a case, a conductor pattern is formed on the surface on which the capacitor is mounted and the mounting of the capacitor may be conducted by using a conductive adhesive.

SECOND EMBODIMENT

Next, a probe card according to a second embodiment of the present invention will be described.

The probe card of the present embodiment has a construction in which a second interconnection board is mounted on a first interconnection board, and the probes are provided on the second interconnection board.

Because of the existence of the first interconnection board separately to the second interconnection board, which is used for carrying the probes, there is no or less restriction imposed to the first interconnection board with regard to the material or size of the first interconnection board.

Thus, it is possible to use a relatively low-cost substrate of low precision such as a glass-epoxy laminated substrate for the first interconnection board. Further, the first substrate can have a large thickness of several millimeters without deteriorating the accuracy of the test.

Of course, it is possible to form the first interconnection board with the same material used for the second interconnection board. In such a case of forming the first and second interconnection boards by the same material, the problem of warp of the second substrate caused by the difference of thermal expansion coefficient between the first and second interconnection boards can be effectively eliminated.

With regard to the foregoing second interconnection board, it is preferable to use a substrate having an inner via-contact structure in which an interconnection layer is provided together with an inner via-contact as explained with reference to the first embodiment. By using such an inner via structure, it becomes possible to construct an intricate and complex interconnection circuit between the probes on the second interconnection board and the electrodes formed on the first interconnection board. The second interconnection board preferably has a thickness of 1 mm or less.

By using such a second interconnection board together with a decoupling capacitor mounted upon a rear side (the side opposite to the side on which the probes are provided) thereof, it becomes possible to cut the high-frequency noise caused in the power line very effectively when the semiconductor chip is tested at the clock frequency of 1 GHz or more. It should be noted that such a second interconnection board having the thickness of 1 mm and including therein the via-contacts can be formed by a build-up process or alternatively by a simultaneous lamination process, in which separately formed interconnection layers are laminated by using a conductive adhesives.

When testing plural semiconductor chips formed on a wafer, it is necessary to use a substrate having a size of 50–100 mm for each edge and a thickness of 1 mm or less for the second interconnection board. In the case of using such a large-size substrate for the second interconnection board, it is important to reduce the difference of thermal expansion coefficient between the second interconnection board and the semiconductor chip to be tested as much as possible, preferably to about 2 ppm/° C. or less.

Thus, it is desirable to use a specifically designed probe card for the semiconductor chips formed on a specific wafer. In the case of testing semiconductor chips formed on a silicon wafer having a thermal expansion coefficient of about 4 ppm/° C., it is therefore desired that the second interconnection board of the probe card has a thermal expansion coefficient of about 4±2 ppm/° C.

A second interconnection board having such a low thermal expansion coefficient can be formed for example by providing the interconnection layer on a core layer of a resin-infiltrated carbon-fiber substrate or an invar substrate having therein a penetrating interconnection. When using a resin-infiltrated carbon fiber material for the second interconnection board, it is possible to use a material produced by infiltrating a resin such as an epoxy resin into a carbon fiber fabric and curing the infiltrated resin. In the case of using an invar substrate, an invar alloy of 64% Fe–36% Ni is used in the form of a plate.

In the probe card of the present embodiment, it should be noted that there exists a gap or space between the first interconnection board and the second interconnection board, and thus, a decoupling capacitor explained in the previous embodiment with reference to FIG. 5 may be mounted on the rear surface of the second interconnection board by using such a space. Further, it is also possible to provide other passive components such as inductor or resistor also on the rear surface of the second interconnection board while utilizing the foregoing space. In addition, it is possible to mount a BOST (build-out self test) chip on the rear surface of the second interconnection board by using the space. It should be noted that a BOST chip is an LSI that accommodates therein a part of the test circuits, which is usually provided in a test LSI in the form of a BIST (built-in self-test) chip.

In the case of testing plural semiconductor chips formed on a wafer, it is necessary that all the plural probes make a reliable contact upon respective corresponding electrodes on the semiconductor chips simultaneously. Thus, the probes have to have the same height on the second interconnection board at the tip end thereof.

When there exists a difference of thermal expansion coefficient between the first interconnection board and the second interconnection board, there is inevitably caused a warp in the second interconnection board and the tip ends of the probes are no longer aligned on a flat plane. Thereby, reliable contact of the probes is no longer achieved.

In order to avoid this problem, therefore, it is necessary to eliminate the warp of the second interconnection board caused by the difference of thermal expansion coefficient between the second interconnection board and the first interconnection board.

From this viewpoint, the use of a resin-infiltrated carbon fiber substrate or an invar substrate formed with penetrating interconnection therein for the core layer of the second interconnection board is advantageous because of the large bending elastic modulus of the core layer and hence high resistance against bending.

Further, it should be noted that bending of the second interconnection board caused by thermal stress can be minimized by connecting the second interconnection board to the first interconnection board by means of a pin grid array. In such a structure, the thermally induced strain caused by the difference of thermal expansion coefficient between the first interconnection board and the second interconnection board is absorbed successfully by the pin grid array. While such a construction allows soldering of the pins with corresponding electrodes, the use of detachable connection structure is more advantageous in view of the possibility of further reduction of the thermally induced strain in the second interconnection board by the play existing in such a detachable connection.

It should be noted that such a use of detachable connection structure for connecting the second interconnection board to the first interconnection board provides additional advantageous effect in that testing of a different semiconductor chip having a slightly different arrangement for the electrode pads can be conducted by merely replacing the second interconnection board with another one having a slightly different interconnection pattern. Thus, the probe card of the present embodiment can be used for testing of various different semiconductor chips.

On the other hand, in the case the semiconductor chip to be tested has a significantly different construction as compared with the semiconductor chip tested previously, it is necessary to design the probe card such that the probe card can carry replaceable pin-electronic components such as drivers or comparators. Thus, the probe card of the present embodiment realizes such a construction by providing the replaceable pin-electronic components at the side of the first interconnection board away form the second interconnection board by way of a detachable connection structure.

In relation to this feature, it should be noted that Japanese Laid-Open Patent Application 2001-102418 discloses a detachable pin-electronic component. This prior art structure, however, uses a pin-electronic module accommodating therein a bare chip and having connection terminals at both sides thereof. Further, the pin-electronic module of this prior art carries a cooling jacket at a lateral side thereof. Thus, such a construction requires an extremely high-level mounting technology and is not easy to implement by using commercially available components. Further, bare chips are not easily purchased in the market.

The probe card of the present embodiment uses ordinary module structure formed of commercially available package components in the form in which the package components are mounted on a substrate. Further, by using a FPGA (field-programmable gate array) for the logic operational unit such as a comparator, which has to be changed according to the model or type of the semiconductor chip, it becomes no longer necessary to produce a specific test chip exclusively designed for testing a specific semiconductor chip. By using a FPGA, the probe card can be used for various different semiconductor chips by merely changing the logic construction.

According to the testing method of the present invention, it becomes possible to reduce the power line noise, which is formed when testing a ultrahigh speed semiconductor chip at an ultrahigh clock rate such as 1 GHz or more, by providing the decoupling capacitor at the rear side opposite to the side of the probe card where the probes are provided, as noted before.

In such a construction, it is not always true that a better test result is obtained by setting the impedance between the probe and the decoupling capacitor as small as possible. While the test itself may be conducted successfully under an ideal condition in which the impedance is ideally minimized, the semiconductor chip used in the actual package is subjected to a power line noise to some extent, and it is desired that the test of the semiconductor chip conducted by the probe card can guarantee the operation of the semiconductor chip under the actual condition in which the power line noise is not completely cut off.

In the case of testing a semiconductor chip for use in a semiconductor package having an impedance Zp between the chip and the decoupling capacitor, therefore, it is desirable to set the impedance between the probe and the decoupling capacitor on the probe card also to be generally equal to the foregoing impedance value Zp. From the practical viewpoint, it is preferable that the probe card has an impedance between the probe and the decoupling capacitor provided at respective, opposite sides of the probe card substrate such that the impedance falls in the range of −50% to +100% of the impedance between the semiconductor chip to be tested and the decoupling capacitor in the state the semiconductor chip is assembled in the form of a semiconductor package.

The test of the semiconductor chip can be conducted any of before or after the semiconductor chip is divided out from a wafer.

Figure 9:
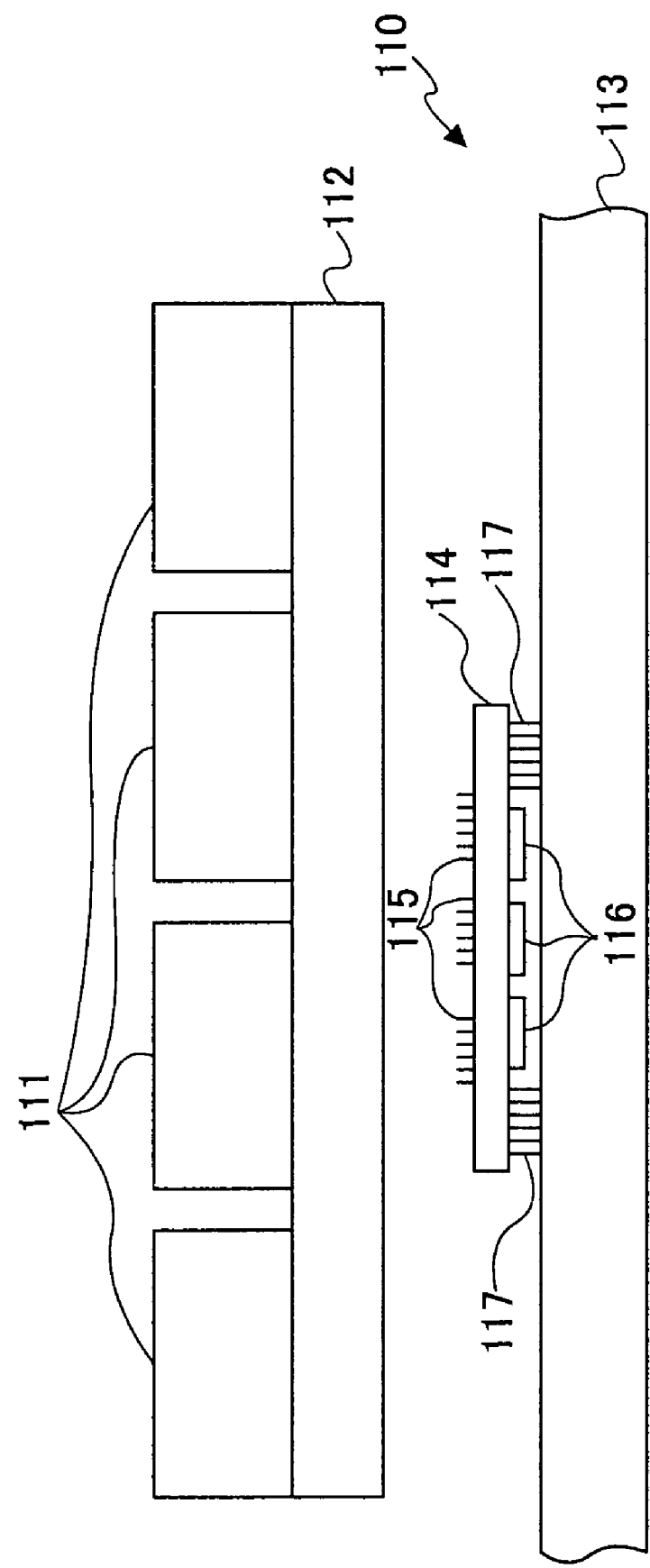
FIG. 9 is a diagram showing the construction of a probe card according to a second embodiment of the present invention.

FIG. 9 shows an example of the probe card 110 according to the foregoing second embodiment of the present invention.

Referring to FIG. 9, the probe card 110 is used for testing electric properties of a semiconductor chip on a wafer in the state the wafer is held by a wafer chuck 111 and includes a first interconnection board 113 formed of a glass-epoxy multilayer interconnection substrate having a thickness of 7 mm and a second interconnection board 114 having a pin-grid array 117 is mounted on the first interconnection board 113 by soldering the pin-grid array 117 upon the first interconnection board 113.

Further, it can be seen that the second interconnection board 114 carries probes 115 on a top surface thereof and decoupling capacitors on a bottom surface thereof.

Figure 10:
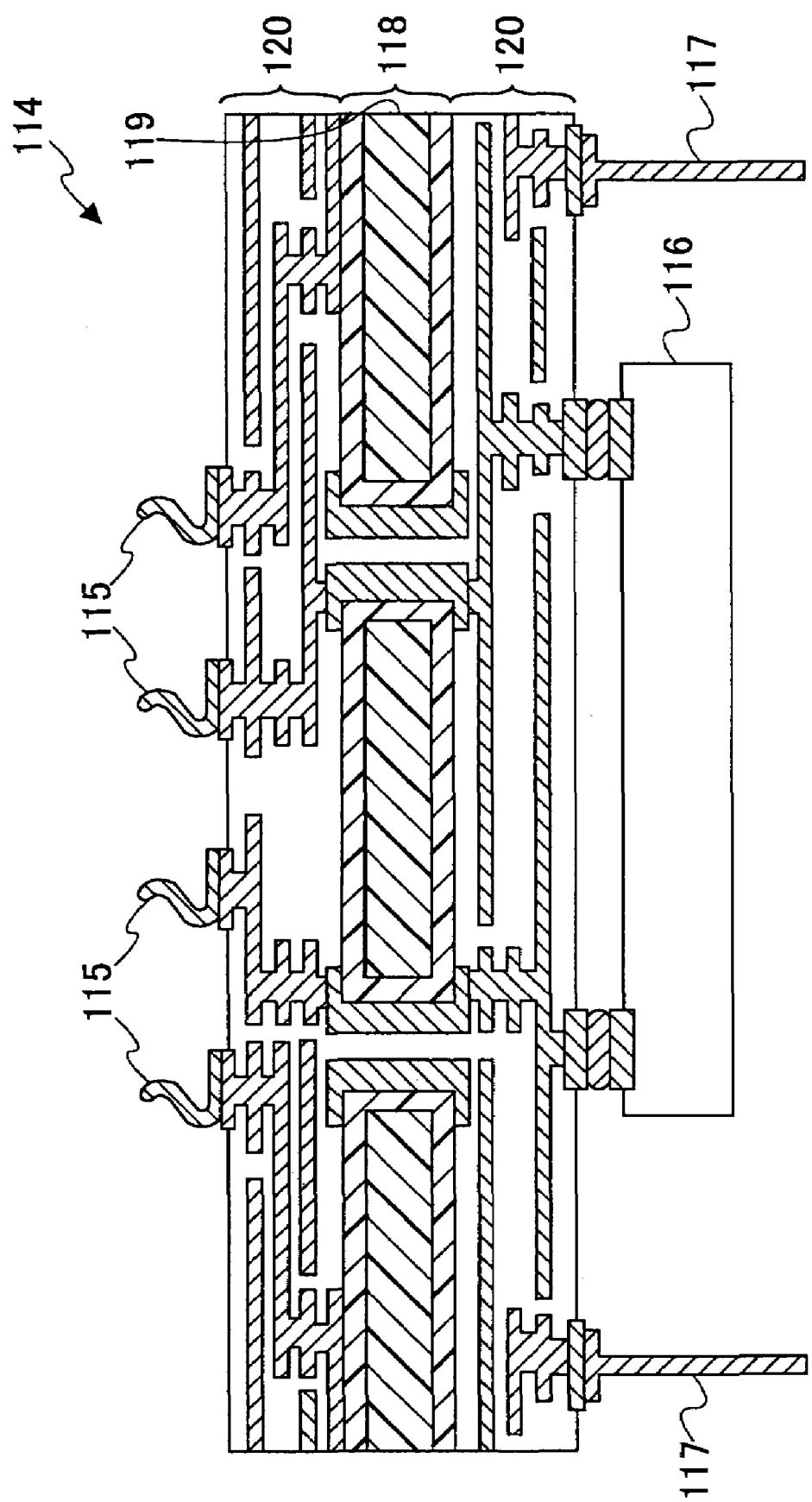
FIG. 10 is a diagram showing a part of FIG. 9 in detail.

FIG. 10 shows the second interconnection board 114 of FIG. 9 in detail.

Referring to FIG. 10, it can be seen that there are formed two build-up interconnection layers 20 each having a four-layer construction at both sides of a core layer 18, wherein the core layer 18 has a thickness of 0.6 mm and the probe card 110 has an overall thickness of 1 mm. In the illustrated example, the probe card 110 has a size of 40 mm for each edge.

The core layer 18 includes a carbon-resin composite plate 119 having a thickness of 0.5 mm and formed by infiltrating an epoxy resin into a carbon fiber fabric and has a construction in which epoxy resin films are laminated at both sides of such a carbon-resin composite plate 119.

Because the carbon fibers constituting the carbon-resin composite plate 119 are a conductive material, the core layer 18 having a through-hole interconnection structure therein is formed by the process steps of drilling the through-holes in the carbon-resin composite plate 119, laminating the epoxy resin films at both sides of the carbon-resin composite plate 119, filling the drilled through-holes by the epoxy resin by causing the epoxy resin films to undergo melting by applying heat, and drilling smaller through-holes in the epoxy resin filling the previously formed through-holes. Thereafter, the process similar to the one used for forming a glass-epoxy core layer is conducted by plating the inner surface of the through-hole with a metal film, and filling the inner space of the through-hole by an epoxy resin.

With regard to the build-up interconnection layers 120 formed on the core layer 118, it should be noted that each build-up interconnection layer 120 includes a multilayer interconnection structure formed with a 25 μm line-and-space pitch. Thereby, the interconnection layers forming a part of the multilayer interconnection structure in the build-up interconnection layer 120 are connected with each other by using an inner via-contact.

In the illustrated example, the core layer 18 has a thermal expansion coefficient of 1 ppm/° C., and the second interconnection board 114 as a whole has a thermal expansion coefficient of 4 ppm/° C.

As explained before, the second interconnection board 114 carries thereon the probes 115, wherein the probes 115 are connected to the exposed electrodes formed on the second interconnection board 114 by way of soldering. Thereby, the tip end of each probe 115 is bent or twisted so as to make a contact with the corresponding electrode pads on the semiconductor chip to be tested in a substantially perpendicular direction with regard to the plane of the semiconductor chip. For example, the second interconnection board 114 may carry a large number of probes 115 so as to enable testing of nine semiconductor chips simultaneously.

It should be noted that the bottom surface of the second interconnection board 114 carries pins forming the pin grid array 117 at the peripheral part thereof, wherein each pin of the pin grid array 117 has a length of about 3 mm. Further, the second interconnection board 114 carries the decoupling capacitor 116 also on the bottom surface thereof at an inner region located inside the region where the pin grid array 117 is formed. The decoupling capacitor 116 has a construction similar to the one explained in the previous embodiment with reference to FIG. 5 and is mounted upon the bottom surface of the second interconnection board 114 by way of a solder bump connection. The capacitor 116 may have a size of 5 mm for each edge and a capacitance of 0.3 μF, for example. Further, the capacitor 116 may have an internal impedance of 20 pH.

By providing the decoupling capacitor 116 on the bottom surface of the second interconnection board 114, it becomes possible to reduce the inductance between the probe 115 and the decoupling capacitor by the factor of ⅕–1/10 as compared with the conventional construction that uses a single probe card substrate and provides the decoupling capacitor at the bottom surface of the foregoing single probe substrate. As a result, the present invention enables testing of the semiconductor chip while operating the semiconductor chip at the clock rate of 1 GHz or more. Thereby, the occurrence of power-line noise is suppressed effectively and the testing can be conducted at high precision.

Figure 11:
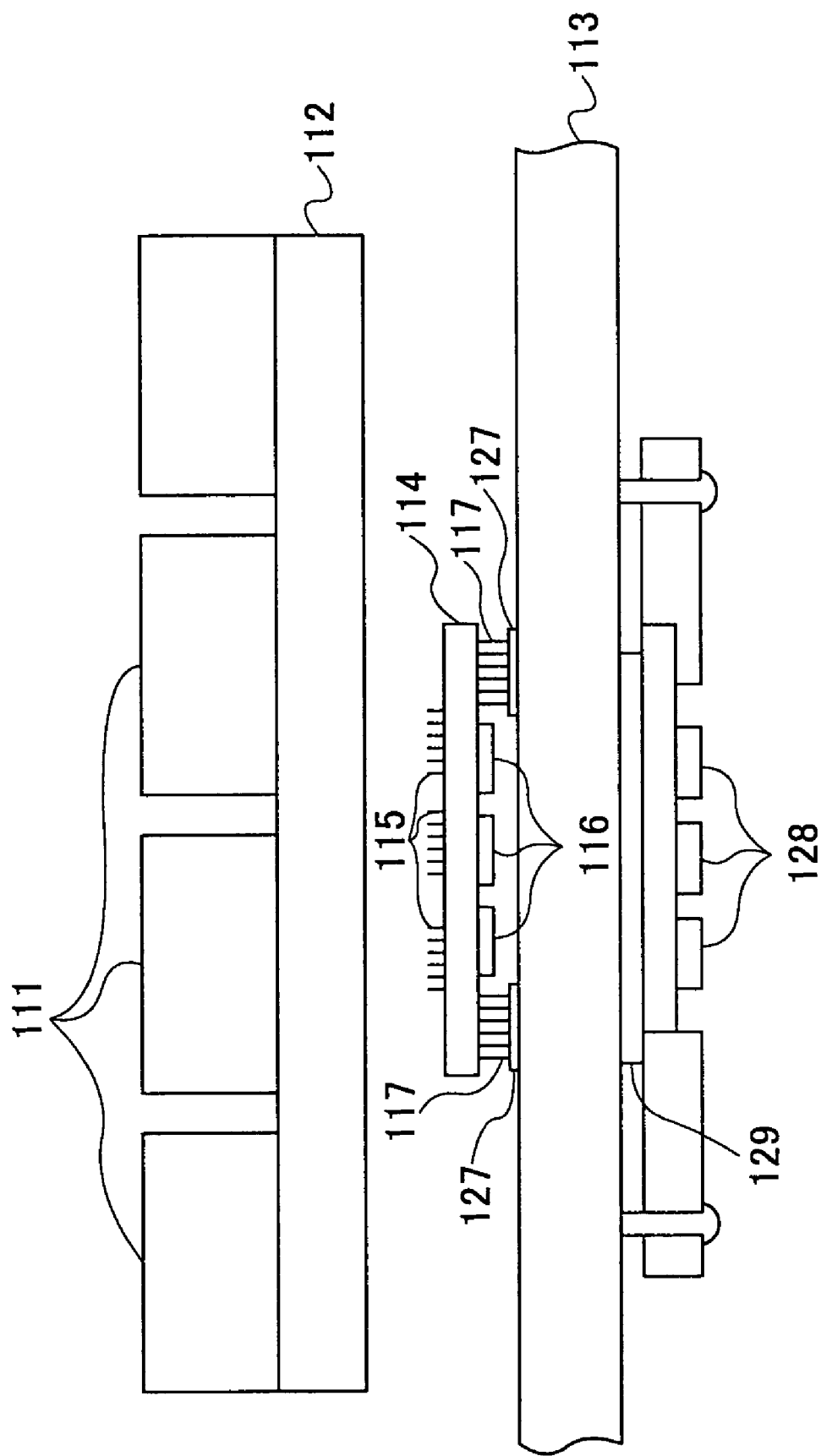
FIG. 11 is a diagram showing a modification of the probe card of FIG. 9.

FIG. 11 shows another a probe card according to another example of the present embodiment, wherein those parts corresponding to the parts described previously are designated by the same reference numerals and the description thereof will be omitted.

Referring to FIG. 11, the second interconnection board 114 is mounted upon the first interconnection board 113 by way of the pin grid array 117 similarly to the example of FIG. 9 except that the pin-grid array 117 of FIG. 11 is not soldered upon the first interconnection board 113 but is connected detachably thereto by way of a connector 127 provided on the first interconnection board 113.

Further, it should be noted that the first interconnection board 113 carries, on a bottom surface thereof, a pin electronic module 128, wherein the pin electronic module 128 is a module formed of various components, such as driver or logic LSIs, power supply components, passive components and the like, mounted on the first interconnection board 113. It should be noted that the bottom surface of the first interconnection board 113 carries a land grid array electrodes and the pin electronic module 128 is connected to the interconnection board 113 by a pogopin array 129 having movable contact pins. Thereby, the module 128 is screwed upon the interconnection board 113.

According to the probe card of the present embodiment, the use of first and second interconnection boards 113 and 114 enables elimination or reduction of constraints imposed on the first interconnection board 113 not carrying the probes 115 thereon with regard to the material or size, and the cost of the probe card can be reduced substantially. Further, when any of the first and second interconnection boards is damaged, the probe card is easily repaired by merely replacing the damaged interconnection board. Thereby, the cost of maintenance can be reduced.

Further, the construction that allows replacement of the second interconnection board 114 enables the use of the probe card for testing various different semiconductor chips by replacing the second interconnection board 114 carrying thereon the probes 115 according to the type and model of the semiconductor chip.

As the probe card of the present embodiment allows to provide the decoupling capacitor 116 immediately adjacent to the probe 115, the inductance between the probe 115 and the decoupling capacitor 116 is minimized and it becomes possible to test the semiconductor chip in the state the semiconductor chip is operating at ultrahigh speed.

In addition, by setting the impedance between the tested semiconductor chip and the decoupling capacitor to be generally equal to the impedance between the semiconductor chip and the decoupling capacitor in the actual semiconductor package, the test can be conducted in the state the semiconductor chip is operated in the actual product.

Further, the probe card of the present invention enables the testing of a number of semiconductor chips simultaneously. Further, in view of the fact that the same probe card can be easily adapted to semiconductor chips of various different types or models, the cost of testing is reduced significantly with the probe card of the present embodiment.

THIRD EMBODIMENT

Figure 12:
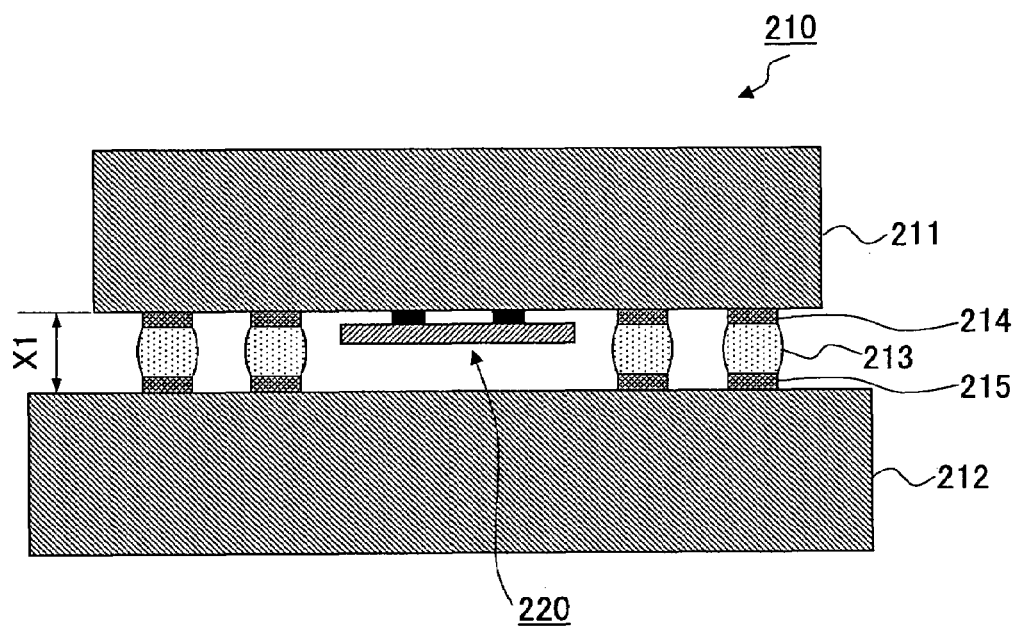
FIG. 12 is a diagram showing a semiconductor device according to a third embodiment of the present invention.

FIG. 12 shows the construction of a semiconductor device 210 according to a third embodiment of the present invention.

Referring to FIG. 12, the semiconductor 210 is formed of a semiconductor chip 211 including therein active semiconductor elements and a capacitor 220 electrically connected to the semiconductor chip 211.

In the illustrated example, the semiconductor chip 211 is mounted upon a package substrate 212 by way of solder bumps 113, wherein the solder bumps 113 are connected to respective, corresponding electrode pads 214 on the semiconductor chip 211 and further to respective, corresponding electrode pads 215 formed on the package substrate 212. Thus, by way of the solder bumps 113, the active elements in the semiconductor chip 211 are connected electrically to the package substrate 212.

In the present embodiment, it should be noted that the capacitor 220 is formed with such a thickness that the capacitor 220 can be mounted on the semiconductor chip 211 at the space or gas formed between the semiconductor chip 211 and the package substrate 212 with a height X1.

Figure 13:
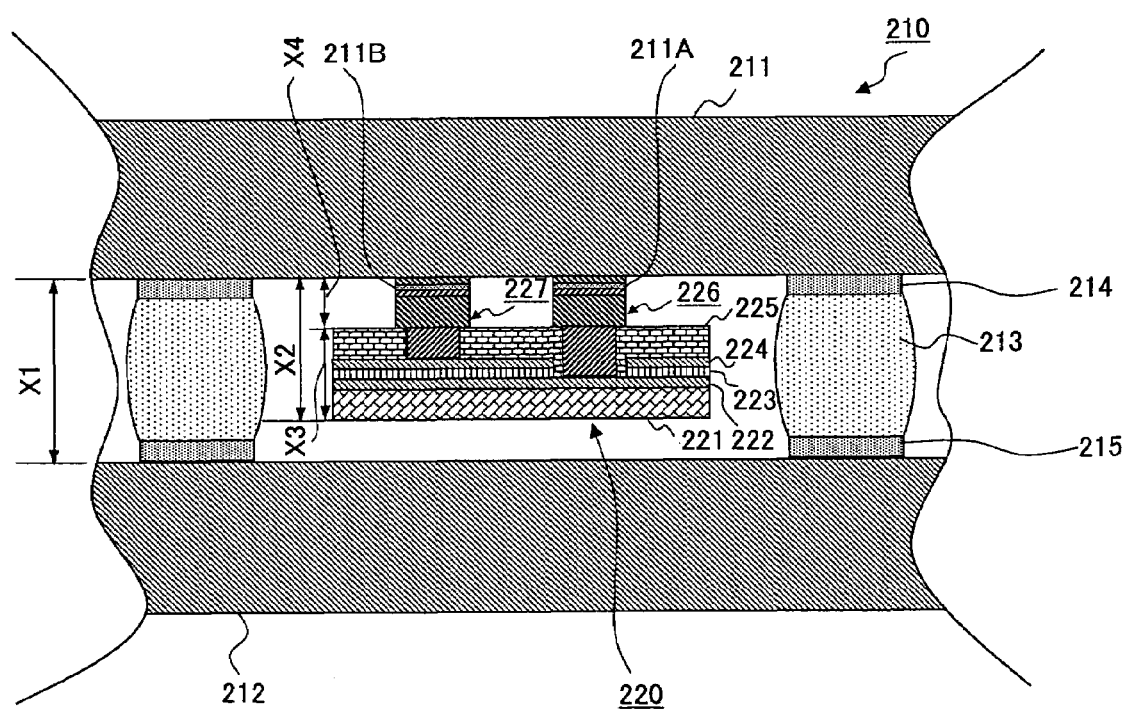
FIG. 13 is a diagram showing a part of FIG. 12 in detail.

FIG. 13 shows the construction of the capacitor 220 in detail, wherein it should be noted that FIG. 13 shows the capacitor 220 in the cross-sectional view in the state the capacitor 220 is mounted on the semiconductor chip 211.

Referring to FIG. 13, the capacitor 220 has a construction similar to the one explained previously with reference to FIG. 5 and includes a BST film 223 sandwiched by a lower electrode film 222 of Cr/Au and an upper electrode film 224 of Au, wherein the lower electrode film 122 is formed on a lower insulation film 221 formed of a polyimide resin. Further, the upper electrode film 224 is covered with an upper insulation film 225 formed of a photosensitive polyimide resin.

Further, there is formed an opening penetrating through the upper insulation film 225, the upper electrode 224 and further through the BST film 223 so as to expose the lower electrode film 222, and an electrode pad 226 is provided so as to extend from the lower electrode film 223 to an electrode pad 211A provided at the bottom surface of the semiconductor chip 211. Thereby, the electrode pad 226 functions as an interconnection pattern connecting the lower electrode 223 to the semiconductor chip 211 electrically.

Similarly, there is provided an opening in the upper insulation film 225 so as to expose the upper electrode 224, and there is provided an electrode pad 227 so as to connect the upper electrode 224 and an electrode pad 211B provided on the bottom surface of the semiconductor chip 211 electrically via the opening.

As will be described later, both of the pads 226 and 227 have an Au/Cu laminated structure and formed to have the same height at the contact surface. Similarly, both of the electrode pads 211A and 211B have an Au/Ni/Cu laminated structure and formed to have the same height at the contact surface. Thus, the electrode pads 211A and 211B on the semiconductor chip 211 make a reliable contact with the electrode pads 226 and 227 of the capacitor 220 when the capacitor 220 is surface-mounted on the semiconductor chip 211.

It should be noted one of the electrode pads 211A and 211B is a ground pad, and thus, the capacitor 220 is inserted electrically between the semiconductor device and a ground plane.

Because the capacitor 220 of the present embodiment has the construction of sandwiching the capacitor part formed of the lower electrode film 222, dielectric film 223 and the upper electrode film 224 by using the resin insulation films 221 and 225, which allows reduction of the film thickness, the overall thickness of the capacitor 220 can be reduced substantially as compared with the case of providing the capacitor part on a support substrate such as a silicon substrate. Associated with the construction of providing the electrode pads 226 and 227 at the same side of the capacitor, and further in view of the fact that the dielectric film 223 can be formed with a very small thickness of about 100 nm, the overall thickness of the capacitor 220 can be reduced further.

For example, the capacitor 220 can be formed such that the total capacitor thickness X3, defined as the thickness of the capacitor 220 as measured from the bottom surface of the lower insulation film 221 to the top surface of the upper insulation film 225, has the value not exceeding 10 μm. Thereby, the electrode pads 226 and 227 are formed such that the amount of projection X4 beyond the upper insulation film 225 does not exceed 10 μm, wherein it should be noted that the projection X4 includes also the thickness of the electrode pads 211A and 211B on the bottom surface of the semiconductor chip 211.

Thus, the capacitor 220 can be formed such that the mounting height X2 of the capacitor 220, defined as the sum of X3 and X4, does not exceed 25 μm.

In view of the fact that the height X1 of the solder bump 213 is generally in the range of 70–80 μm, the capacitor 220 can be successfully mounted upon the bottom surface of the semiconductor chip 210 by surface mounting technology while utilizing the space or gap formed between the semiconductor chip 211 and the package substrate 212. Thereby, the distance between the semiconductor chip 211 and the capacitor 220 is minimized and the high-frequency noise is effectively suppressed by using the capacitor 220 as a decoupling capacitor. Further, it should be noted that the capacitor 220 has a construction much simpler than the capacitor used for the interposer and the cost as well as reliability of the capacitor is improved substantially.

Figure 14:
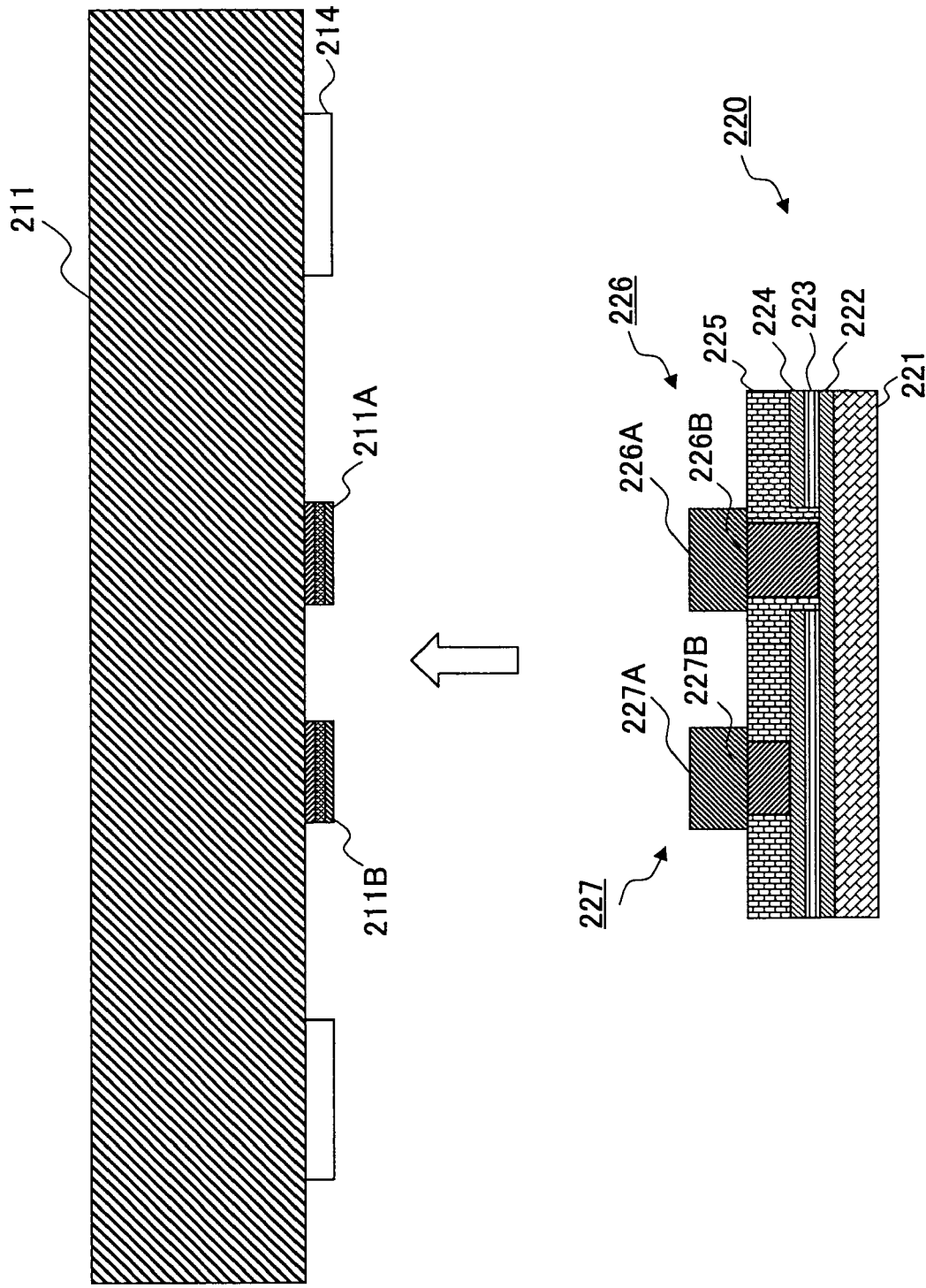
FIG. 14 is a diagram showing the process of mounting the capacitor on the semiconductor chip in the construction of FIG. 13.

FIG. 14 shows the mounting process of the capacitor 220 on the semiconductor chip 221.

Referring to FIG. 14, the electrode pad 226 of the capacitor 220 is formed of an electrode plug 226B of Cu embedded in the resin insulation film 225 with a length of 1 μm and an electrode pad 226A of Au formed on the top surface of the resin layer 225 in continuation with the Cu electrode plug 226B with a thickness of 10 μm.

Similarly, the electrode pad 227 of the capacitor 220 is formed of an electrode plug 227B of Cu embedded in the resin insulation film 225 with a length of 1 μm and an electrode pad 227A of Au formed on the top surface of the resin layer 225 in continuation with the Cu electrode plug 227B with a thickness of 10 μm.

Each of the electrode pads 211A and 211B has a three-layer lamination structure including an uppermost Au layer having a thickness of 0.2 μm, an intermediate Ni layer having a thickness of 2 μm provided underneath the Au layer, and a lowermost Cu layer having a thickness of 3 μm.

Thus, when mounting the capacitor 220 upon the semiconductor chip 211, the Au electrode pads 226 and 227 are urged against the Au layers of the electrode pads 211A and 221B respectively and are bonded with each other by forming Au—Au ultrasonic bonding.

Figure 15A:
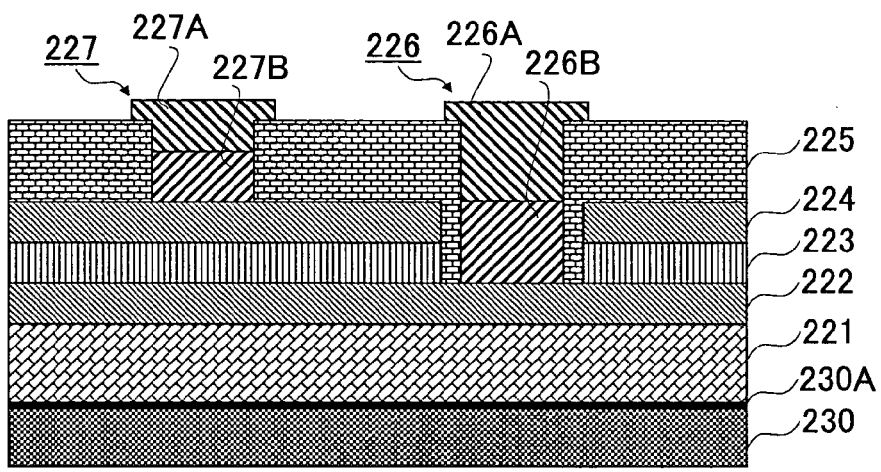
FIGS. 15A and 15B are diagrams showing the fabrication process of the capacitor shown in FIG. 13.
Figure 15B:
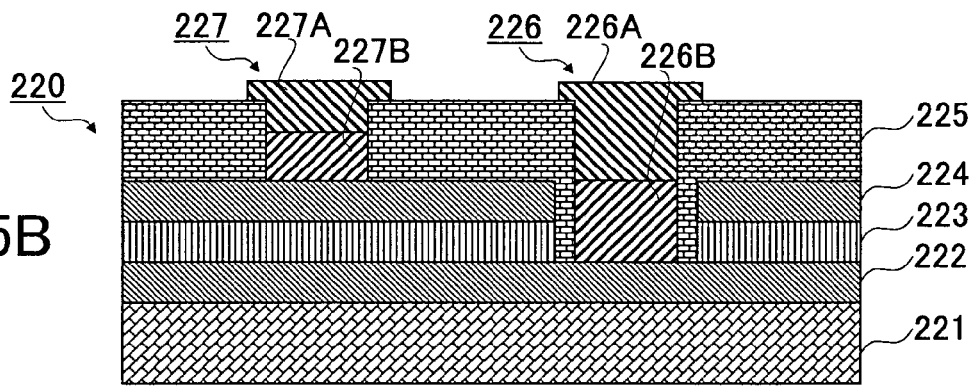

FIGS. 15A and 15B are diagrams showing the process of forming the capacitor 220 of FIG. 14.

Referring to FIG. 15A, the capacitor structure including the lamination of the layers 221–225 is formed on a silicon substrate 230, wherein the silicon substrate 230 carries thereon an adhesion layer 230A of a Ti/Cu lamination structure. The formation of the capacitor on the silicon substrate 230 is conducted just in the same way as in the case of FIGS. 6A–6G.

After the structure of FIG. 15A is obtained, the present embodiment removes the silicon substrate 230 in the step of FIG. 15B together with the adhesion layer 230A by conducting a wet etching process.

As a result of the step of FIG. 15B, the thickness of the capacitor 220 is reduced significantly as compared with the capacitor formed by the process of FIGS. 6A–6G. Because the resin layer 251 has a thickness of a few microns, the capacitor 220 is held thereon stably even though the capacitor 220 includes therein thin and brittle BST film 223.

FOURTH EMBODIMENT

Figure 16:
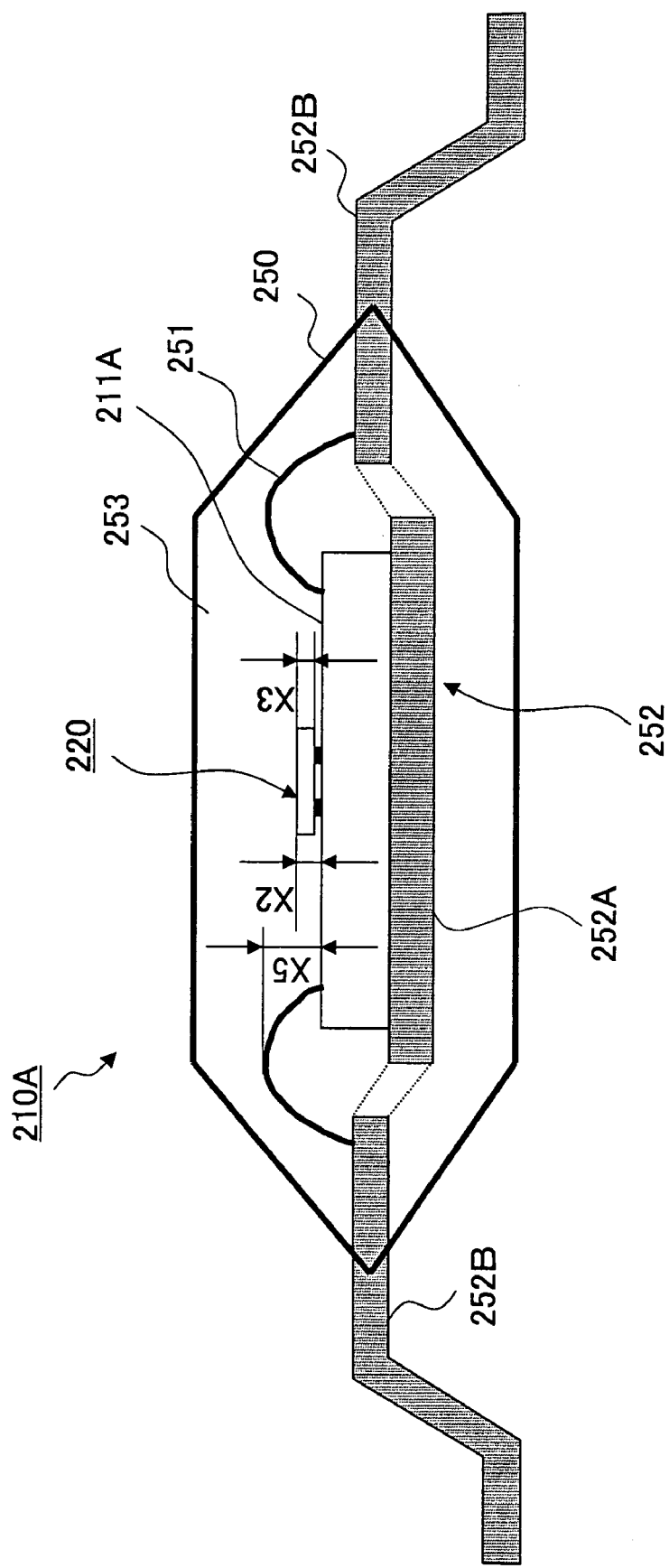
FIG. 16 is a diagram showing the construction of a semiconductor device according to a fourth embodiment of the present invention.

FIG. 16 shows the construction of a semiconductor device 210A according to a fourth embodiment of the present invention, wherein those parts corresponding to the parts described previously are designated by the same reference numerals and the description thereof will be omitted.

Referring to FIG. 16, the semiconductor device 210A carries a semiconductor chip 211A similar to the semiconductor chip 211 on a lead frame 252, and the capacitor 220 is mounted upon the semiconductor chip 211A similarly to the case of g12 and 13.

More specifically, the semiconductor chip 2111A is held on a stage part 252A of the lead frame 252 and is sealed by a molded resin package 253.

The resin package 253 holds lead conductors 252B, and the semiconductor chip 211A is connected electrically to the lead conductors 252B by way of bonding wires 251.

Here, it should be noted that the maximum height X5 of the bonding wire 251 generally determines the thickness of the molded package resin 253, and thus, the height X2 of the capacitor 220 as measured from the top surface of the semiconductor chip 211A should not exceed the height X5, which generally has the value of about 150 μm.

In the capacitor 220 of the present embodiment, the height X2 can be reduced to 10 μm or less. Thus, the construction as represented in FIG. 15 can be achieved without difficulty by using the capacitor 220 of the present embodiment.

It should be noted that the upper and lower resin insulation films 221 and 225 are not limited to polyimide but various other resins such as a bismaleimide triazine (BT) resin, polytetrafluoroethylene (PTFE) resin, a benzocylcobutene (BCB) resin, an acryl resin, diallyl phtalate resin, and the like. Thereby, it should be noted that the insulation film 121, on which the high-K dielectric film is grown with a small thickness of about 100 nmm, has to have a smooth surface. Thus, it is preferable that the insulation film 121 has a surface roughness of 5 nm or less.

Further, from the viewpoint of handling, it is desirable that the capacitor 220 of FIG. 13 has a size of 2 mm×1 mm or an area of 2 mm² or less.

Further, the present invention is not limited to the embodiments described heretofore, but various variations and modifications may be made without departing from the scope of the present invention.

What is claimed is:

1. A probe card for testing a semiconductor chip, comprising:
    a plurality of probes;
    a build-up interconnection layer having a multilayer interconnection structure therein, said interconnection structure comprising plural interconnection layers and one or more resin insulation layers insulating said interconnection layers from each other, said build-up interconnection layer carrying said plurality of probes on a top surface thereof in electrical connection with said multilayer interconnection structure; and
    a decoupling capacitor embedded entirely within said insulation layer located between a lower interconnection layer and an upper interconnection layer such that its top, bottom and side surfaces are in contact with said resin insulation layer constituting said build-up interconnection layer in electrical connection with one of said probes via said multilayer interconnection structure,
    said multilayer interconnection structure including an inner via-contact in the vicinity of said probe.

2. A probe card as claimed in claim 1, wherein said capacitor has a thickness generally equal to or less than a thickness of said resin insulation layer.

3. A probe card as claimed in claim 1, wherein said capacitor is formed in said build-up interconnection layer directly underneath one of said probes.

4. A probe card as claimed in claim 1, wherein said capacitor includes a dielectric film of a complex oxide containing at least one metal element selected from the group consisting of Sr, Ba, Pb, Zr, Bi, Ta, Ti, Mg and Nb.

5. A probe card as claimed in claim 1, wherein said capacitor includes upper and lower electrodes sandwiching a dielectric film, said upper and lower electrodes containing at least one metal element or a metal oxide selected from the group consisting of Pt, Au, Cu, Pb, Ru, a Ru oxide, Ii, an Ir oxide, and Cr.

6. A testing method of a semiconductor device by using a probe card,
    said probe card comprising: a plurality of probes; a build-up interconnection layer having a multilayer interconnection structure therein, said build-up interconnection layer carrying said plurality of probes on a top surface thereof in electrical connection with said multilayer interconnection structure; and a capacitor embedded in a resin insulation layer constituting said build-up interconnection layer in electrical connection with one of said probes via said multilayer interconnection structure, said multilayer interconnection structure including an inner via-contact in the vicinity of said probe,
    said method comprising the steps of:
    causing said probe card to make a contact with a semiconductor chip to be tested such that said semiconductor chip is in electrical connection with said probe card; and
    testing electric properties of said semiconductor chip,
    said method further comprising the step, before contacting said probe card to said semiconductor chip, of setting an impedance between said probe and said capacitor to be substantially equal to an impedance of a semiconductor package including therein said semiconductor chip and a capacitor, for a part between said semiconductor chip and said capacitor.

7. A testing method as claimed in claim 6, wherein said test is conducted in the state said semiconductor chip forms a semiconductor wafer.